United States Patent [19]
Matsumoto

[11] Patent Number: 5,315,299
[45] Date of Patent: May 24, 1994

[54] MULTIPLEX DATA COMMUNICATING APPARATUS APPLICABLE TO AUTOMOTIVE VEHICLE

[75] Inventor: Takashi Matsumoto, Yokosuka, Japan

[73] Assignee: Nissan Motor Co., Ltd., Yokohama, Japan

[21] Appl. No.: 14,689

[22] Filed: Feb. 8, 1993

[30] Foreign Application Priority Data

Feb. 14, 1992 [JP] Japan .................. 4-059794

[51] Int. Cl.$^5$ .................................... H03M 5/08
[52] U.S. Cl. ............................... 341/53; 375/22
[58] Field of Search ............ 341/53, 51; 375/22, 375/23; 370/9

[56] References Cited

U.S. PATENT DOCUMENTS 4,176,250  11/1979  Berglind ............................ 370/9

Primary Examiner—Brian K. Young
Attorney, Agent, or Firm—Foley & Lardner

[57] ABSTRACT

A data communication apparatus applicable to an automotive vehicle is disclosed in which a transmission data having a combination of bit data of "1" and/or "0" is coded into a communication signal based on an interval of time on a rising edge and/or a falling edge and the communication signal is transmitted via at least one signal transmission line. At least one of the intervals of times at a beginning of which a predetermined rising or falling edge occurs and at an end of which the subsequent rising or falling edge occurs is measured at a signal reception side and the communication signal is then decoded into the bit data of either "1" or "0" according to the result of the measured interval of time.

20 Claims, 8 Drawing Sheets

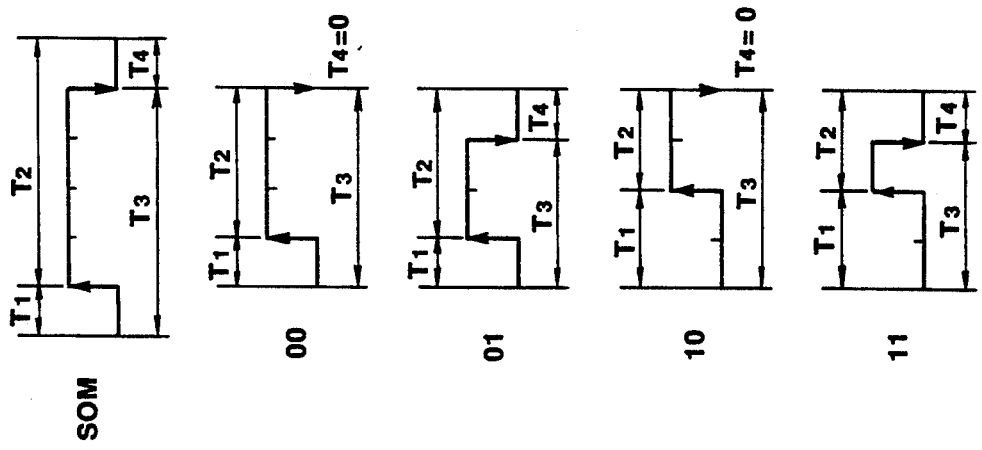

FIG.2(C)

| DATA | PREVIOUS DATA | Tu |
|---|---|---|
| "0" | "0" | 4 |
| "0" | "1" | 3 |
| "1" | "0" | 5 |
| "1" | "1" | 4 |
| SOM+"0" | * | 6 |
| SOM+"1" | * | 7 |

FIG.2(D)

| DATA | PREVIOUS DATA | Td |
|---|---|---|
| "0" | "0" | 4 |
| "1" | "0" | 3 |
| "0" | "1" | 5 |
| "1" | "1" | 4 |

FIG.5(A)

| DATA | COMMUNICATION WAVEFORM |
|---|---|
| 0000 | 01101100 |
| 0001 | 01100110 |
| 0010 | 01100011 |
| 0011 | 00110110 |
| 0100 | 00110011 |
| 0101 | 00011011 |
| 0110 | 01000111 |
| 0111 | 01001110 |
| 1000 | 00101110 |
| 1001 | 00100111 |
| 1010 | 00010111 |
| 1011 | 01110100 |
| 1100 | 01110010 |
| 1101 | 00111010 |
| 1110 | 00111001 |
| 1111 | 00011101 |
| SOM | 01111101 |

FIG.5(B)

| DATA | T1 | T2 | T3 | T4 |
|---|---|---|---|---|
| 0000 | 1 | 3 | 3 | 4 |
| 0001 | 1 | 4 | 4 | 3 |
| 0010 | 1 | 5 | 5 | 2 |
| 0011 | 2 | 3 | 3 | 3 |
| 0100 | 2 | 4 | 4 | 2 |
| 0101 | 3 | 3 | 3 | 2 |
| 0110 | 1 | 4 | 6 | 3 |
| 0111 | 1 | 3 | 5 | 4 |
| 1000 | 2 | 2 | 4 | 4 |
| 1001 | 2 | 3 | 5 | 3 |
| 1010 | 3 | 2 | 4 | 3 |
| 1011 | 1 | 3 | 2 | 3 |
| 1100 | 1 | 5 | 3 | 2 |
| 1101 | 2 | 4 | 2 | 2 |
| 1110 | 2 | 5 | 3 | 1 |
| 1111 | 3 | 4 | 2 | 1 |
| SOM | * | 6 | 2 | 1 |

MULTIPLEX DATA COMMUNICATING APPARATUS APPLICABLE TO AUTOMOTIVE VEHICLE

BACKGROUND OF THE INVENTION

1. Field of the Invention

The present invention relates generally to a communication apparatus which communicates data in a multiplex transmission mode between transmission and reception units having a feature in coded communication data.

2. Description of the Background Art

A previously proposed multiplex data communication apparatus includes a capacitor coupling by means of which two communication signal lines are connected with a receiving comparator to provide a plurality of differential receptions of a transmission signal to form a digital reception signal. A wired OR output from the reception comparator provides a digital transmission signal. In this case, as a noise trouble measure of the communication lines, each of comparators receiving the communication signals is coupled to the communication signal lines by means of an AC coupling.

In addition, use has been made of a PWM (Pulse Width Modulation) coding method for the communication data.

SOM (Start Of Message) which is a signal segment of the communication signals representing a start of a communication signal is expressed by a combination of "H", "H", "H", "H", "L" and "L" levels for 6 T time period, a bit "1" of the communication data is expressed by a combination of "H", "H", and "L" levels for 3 T time period, and a bit "0" of the communication data is expressed by a combination of "H", "L" and "L" for 3 T time period.

A reception technique is such that a change in a rising edge from "L" to "H" levels is detected for each pulse of the communication signals, a reception synchronization is achieved from the detected rising edge, when the detected rising edge occurs after 4 T time period of the communication signals, the signal segment represents the SOM, when the falling edge occurs after 1 T time period of the communication signals, the bit "0" is determined after 1 T time of the communication signals, when the falling edge occurs after 2 T time period, "1" is determined.

However, as a practical matter, an interline capacitance between the two communication signal lines and stray capacitance such as a unit capacitance cause waveform distortions in the pulses of the communication signals.

Furthermore, if the AC coupling is made for each reception comparator connected to the signal lines, a resistor voltage divided ratio of resistors connected between input ends of the reception comparator and coupling capacitors and a DC component of the communication signals cause a differential offset of the reception comparator to be determined. Such signal distortions and differential offset quantity as described above cause deviation in the waveforms between the transmission signal on the communication signal lines and reception signal on the reception comparator.

From a viewpoint of an electromagnetic wave interference measure, it is more effective to distort the communication signal to a larger degree. However, as the distortion of the waveform of the communication signals becomes larger, a variation in the pulsewidth become larger due to a deviation of the differential offset in the reception comparator. Since the DC component is different between the waveform indicating "0" of the communication signal and that indicating "1" of the communication signal, the DC component being an average of each waveform, the whole DC component of the communication signals is varied according to values of the communication data so that an increase and/or decrease in the pulsewidth become significant.

In addition, when either a single communication signal line is used or the reception comparator is connected in a DC coupling form to the signal communication lines, an environment around the signal communication line(s) such as GND offset between the units and a magnitude in a signal amplitude provides direct causes of deviation of the differential offset. Therefore, it is more difficult to maintain the differential offset constant.

Furthermore, a cross-talk influences pulsewidth. If a shielded wire or twisted pair is used for the communication signal line(s), an inter-line capacitance between the communication signal lines becomes larger than general AV (audio/video) lines. The stray capacitance between lines provides the AC coupling for the communication signal lines.

If one of the communication lines is broken or the one communication line is disconnected at a connector which connects the communication lines and the communication unit, the communication signal on the connected communication line is coupled into the broken communication line via the stray capacitance, thereby influencing the pulsewidth.

With the increase or decrease in the pulsewidth taken into consideration, the decoding of the PWM code is unavoidably required to provide some margin on the pulsewidth. In this case, even if the bit "1" is output to the transmission signal and the pulsewidth of the received signal becomes as short as ½ T time period or less, it may erroneously be determined as the signal of bit "0".

Therefore, an allowance value of an increase or decrease of pulsewidth needs to be below approximately ½ T (1/6 bit) time period.

In the way described below, in the previously proposed communication apparatus, since the change in the pulsewidth in the received communication signal occurs due to the distortion in the signals input to the comparator, the variation in the DC component of the communication signals, or breakage in the one communication signal line, the reception circuit or physical layer needs to be limitedly set so that the pulsewidths of the communication signals do not exceed a predetermined allowable range.

SUMMARY OF THE INVENTION

It is, therefore, a principal object of the present invention to provide a communication apparatus for communicating data in a multiplex transmission mode which can provide a reception signal without being influenced by variations in the pulsewidths of communication signals.

The above-described object can be achieved by providing a data communication apparatus, comprising: a) signal transmitting means for coding a transmission data having a combination of bits "1" and/or "0" data into a communication signal based on an interval of time at which a rising edge occurs, the rising edge being defined as its signal state changing from a relatively low potential level to a relatively high potential level and for outputting the communication signal to at least one signal transmission line; b) first rising edge detecting means for detecting the rising edge of the communication signal inputted via the signal transmission line; c) first rising edge interval of time measuring means for measuring the interval of time at which the rising edge detected by the first rising edge detecting means occurs; and d) decoding means for decoding the communication signal into either bit "1" or bit "0" according to the interval of time measured by the first rising edge interval of time measuring means.

The above-described object can also be achieved by providing a data communication apparatus, comprising: a) signal transmitting means for coding a transmission data having a combination of bits "1" and/or "0" data into a communication signal based on an interval of time at which a falling edge occurs, the falling edge being defined as its signal state changing from a relatively high potential level to a relatively low potential level and for outputting the communication signal to at least one signal transmission line; b) second falling edge detecting means for detecting the falling edge of the communication signal inputted via the signal transmission line; c) second falling edge interval of time measuring means for measuring the interval of time at which the falling edge detected by the second falling edge detecting means occurs; and d) decoding means for decoding the communication signal into either bit "1" or bit "0" according to the interval of time measured by the second falling edge interval of time measuring means.

The above-described object can also be achieved by providing a data communication apparatus, comprising: a) signal transmitting means for coding a transmission data having a combination of bits "1" and/or "0" data into a communication signal based on a first interval of time at which a rising edge occurs, the rising edge being defined as its signal state changing from a relatively low potential level to a relatively high potential level, and based on a second interval of time at which a falling edge occurs, the falling edge being defined as its signal state changing from the relatively high potential level to the relatively low potential level, and for outputting the communication signal to at least one signal transmission line; b) first rising edge detecting means for detecting the rising edge of the communication signal inputted via the signal transmission line; c) second falling edge detecting means for detecting the falling edge of the communication signal inputted via the signal transmission line; d) first rising edge interval of time measuring means for measuring the first interval of time at which the rising edge detected by the first rising edge detecting means occurs; e) second falling edge interval of time measuring means for measuring the second interval of time at which the falling edge detected by the second falling edge detecting means occurs; and f) decoding means for decoding the communication signal into either bit "1" or bit "0" according to the first and second intervals of times measured by the respective first and second rising and falling edge interval of time measuring means.

BRIEF DESCRIPTION OF THE DRAWINGS

FIGS. 1 (A), 1 (B), and 1 (C) are constructional views of coded data of SOM, 00, 01, 10 and 11 indicating a first preferred embodiment according to the present invention.

FIGS. 5 (A) and 5 (B) are explanatory views of data formats with respect to communication waveforms and with respect to time periods T1 through T4.

DESCRIPTION OF THE PREFERRED EMBODIMENTS:

Reference will, hereinafter, be made to the drawings in order to facilitate a better understanding of the present invention.

FIGS. 1 (A) through 1 (C) show a first preferred embodiment of data coding of a communication signal such as SOM, 00, 01, 10, and 11 carried out in an apparatus for communicating data in a multiplex transmission mode.

An SOM (Start Of Message) is, as shown in FIG. 1 (A), provided with one rising edge and one falling edge.

Then, if a subsequent rising edge occurs after 6T time period with reference to an initial rising edge, the communication data represents SOM+"0". Thereafter, if the subsequent rising edge occurs after 7 T time period from the initial rising edge, the communication data represents SOM+"1".

In addition, in a generalized format, if N denotes a natural number equal to or exceeding 1, the subsequent rising edge occurs after $T\times\{4\times(N-1)+6\}$ time period with respect to the initial rising edge, the bit of the communication signal indicates "0". If the subsequent rising edge occurs after $T\times\{4\times(N-1)+7\}$ with respect to the initial rising edge, the bit of "1" occurs.

Similarly, when a subsequent falling edge occurs after 5 T time period with reference to the initial falling edge of SOM, the bit of "0" is determined to occur. If the subsequent falling edge occurs after 4 T time period with respect thereto, the bit of "1" occurs.

In the generalized format, if the subsequent falling edge occurs after $T\times\{4\times(N-1)+4\}$ time period with respect thereto, the bit of "1" occurs.

If the subsequent falling edge occurs after $T\times\{4\times(N-1)+5\}$ time period with respect thereto, the bit of "0" occurs.

The communication waveform of the 2-bit data is expressed as shown in FIG. 1 (B).

Positions of each edge with respect to the time period is expressed as shown in FIG. 1 (C).

In this way, an odd number bit is represented according to a position of the rising edge and an even number bit is represented according to a position of the falling edge.

Then, each rising edge or each falling edge appearing after the SOM represents a data value shown in FIG. 1 (A) depending on its position.

FIG. 1 (B) shows an example of a four-bit data. The data for the respective bits can be expressed as a relationship between edge intervals Tu, Td and data value at the previous same directional edge.

It is noted that since the relationship between both same directional edges on the rising edge or falling edge is maintained although the increase or decrease in the pulsewidths in the communication signals occur, this influence of the relationship described above on the edge interval measurement cannot be received.

Figure 3:
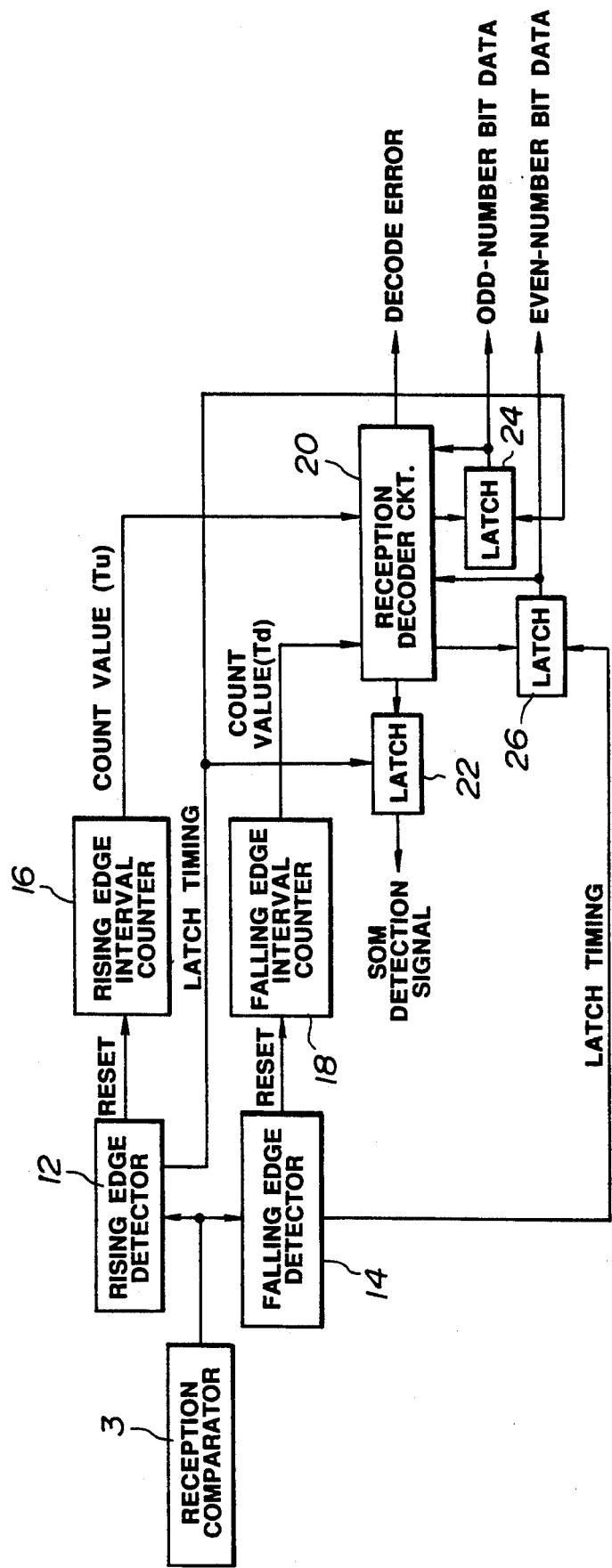
FIG. 3 is a circuit block diagram of a structure of a reception circuit in the first preferred embodiment according to the present invention.

The communication signals thus coded are processed at the reception circuit shown in FIG. 3.

The communication signals from the reception comparator 3 are input to a rising edge detector 12 and to a falling edge detector 14. Each edge detector 12, 14 is connected to the rising edge interval counter 16 and to the falling edge interval counter 18. Each counter output is input to a reception decoder 20.

Each reception signal decoder 20 is additionally provided with latch circuits 22, 24, and 26, respectively.

Whenever the rising edge detector 12 detects each rising edge, a count value Tu representing a rising edge interval of time is output to a reception decoder circuit 20.

The reception decoder circuit 20 is additionally provided with latch circuits 22, 24, and 26.

Whenever the rising edge is detected by the rising edge detector 12, the count value Tu representing the rising edge interval of time is output to the reception decoder circuit 20.

Figure 2A:
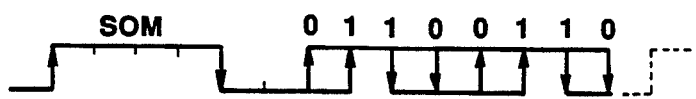
FIGS. 2 (A), 2 (B), 2 (C), and 2 (D) are constructional views of coded data, e.g., SOM 01100110 and SOM 0011 used in the first preferred embodiment according to the present invention.
Figure 2B:
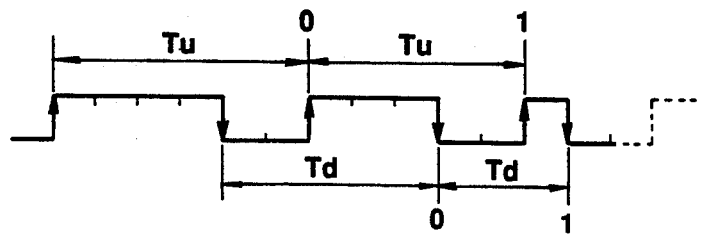

The reception decoder circuit 20 outputs the SOM detection signal and the odd number bit data according to a value of Tu on the basis of, e.g., a data format of FIG. 2 (C) and outputs a decode error indicating that the value of Tu is not present from any one of values shown in FIG. 2 (C).

These outputs of the reception decoder circuit 20 are latched for every detection of the rising edges and the rising edge interval measurement counter 16 is again reset to start counting.

Upon detection of each falling edge by means of the falling edge detection circuit 14, the falling edge interval measurement counter 18 outputs a count value Td representing a falling edge interval time to the reception decoder circuit 20.

The reception decoder circuit 20 outputs an even number bit data from the value of Td on the basis of FIG. 2 (D) and outputs another decode error indicating that the value of Td is not present from any one of those shown in FIG. 2 (D).

These outputs from the reception decoder circuit 20 are latched for every edge detection of falling edges and the falling edge interval measurement counter 18 is again reset to start counting.

In this way, in the example of FIG. 2 (B), SOM+"0" is detected according to the initial Tu=6 and "0" is detected from the initial Td=5. Then, according to the initial Tu=5, "1" is detected. From the subsequent Td=3, the bit "1" is detected so that "0011" is, thus, decoded.

In the first preferred embodiment described above, utilizing a fact that an edge interval of time from the one rising edge of the communication signal to the subsequent rising edge is not changed although the pulsewidth of the communication signal is varied, the interval of time between the times at which the respective rising edges occur is measured and the interval of time between the times at which the respective falling edges occur is similarly measured. Its combination of the intervals of times serves to decode the communication signal into the bits "0" and "1".

Therefore, even if the pulsewidth of the communication signal is increased or decreased, the communication signal can continuously be decoded until the communication signal vanishes.

In addition, a sufficiently distorted communication signal can be transmitted to the communication signal lines without the negative effect of the increase/decrease in the pulsewidth being taken into consideration. If the communication signal has the same frequency, the less electromagnetic wave interference can be received. If the communication signal having the same electromagnetic wave interference characteristic is received, the communication signal with the higher frequency can be transmitted.

In the first preferred embodiment described above, the data of the even-number bit is indicated by the interval of time during which the respective falling edges occur and the data of the odd number bit is indicated by the interval of time during which the respective rising edges occur. The same effect can be achieved by neglecting the falling edges (or rising edges) and all of data are indicated only by the rising edges (or falling edges). In this case, since only the rising or falling edges may be detected, the construction of the data communication apparatus becomes simpler than the first preferred embodiment and its cost can become reduced.

Figure 4:
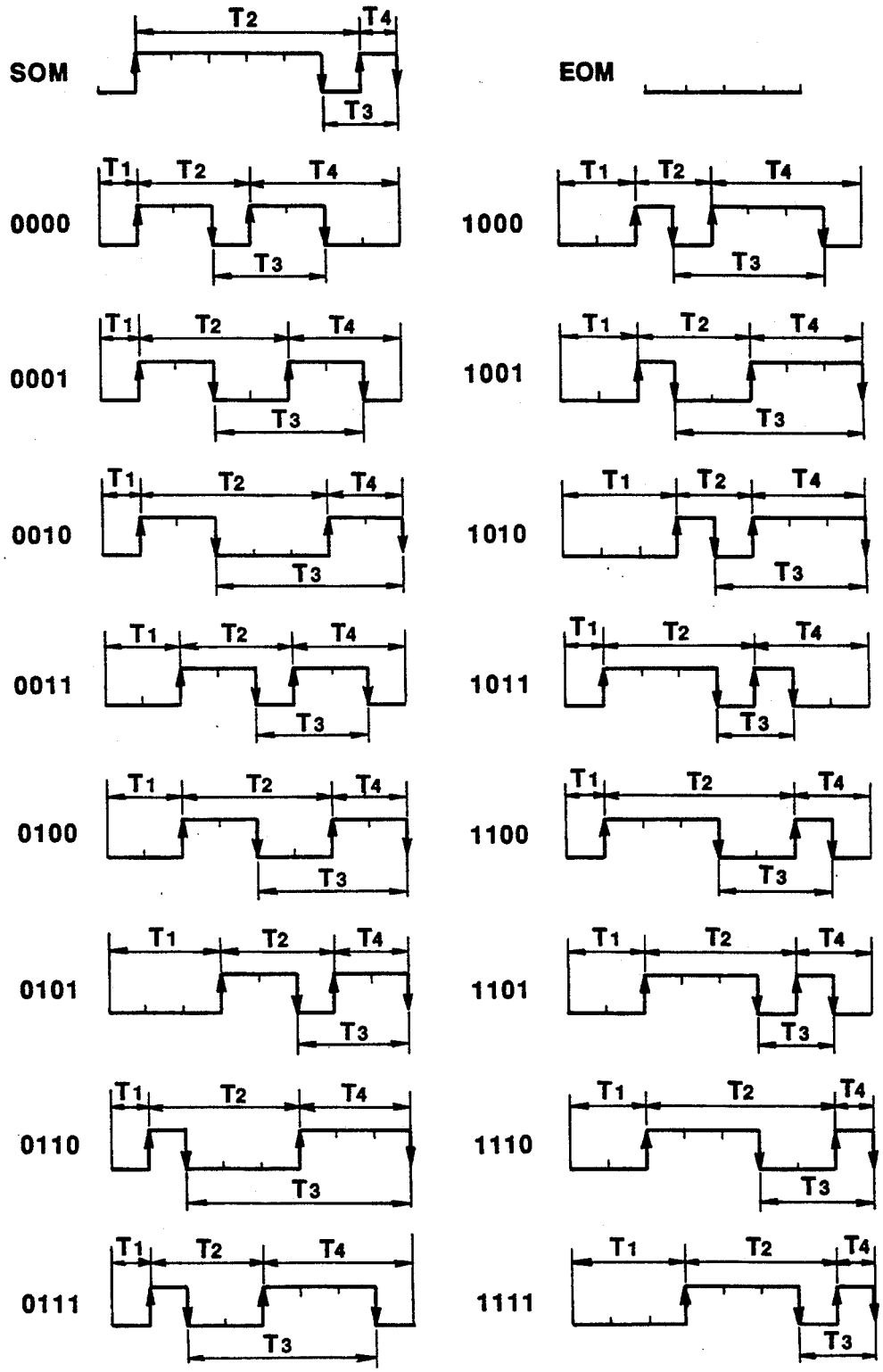
FIG. 4 is integrally data format of SOM, four-bit data, and EOM used in a second preferred embodiment according to the present invention.

Next, FIG. 4 shows a second preferred embodiment of the coding of the communication signal.

In FIG. 4, the coding of a four-bit communication data is carried out by combinations of eight signal levels in eight time periods.

From among the eight signal levels, an initial signal level is set to a low potential level, as shown in FIG. 4, high potential levels being four as a total and low potential levels being four as the total, each of rising edges and falling edges having two positions between the consecutive eight signal levels. Such a combination of the potential levels as described above has 18 total combinations including SOM and EOM. 16 combinations from among the 18 combinations are allocated to four-bit data, as shown in FIG. 4.

A communication waveform for the four-bit data and edge position therefor are shown in FIGS. 5 (A) and 5 (B), respectively.

Figure 6:
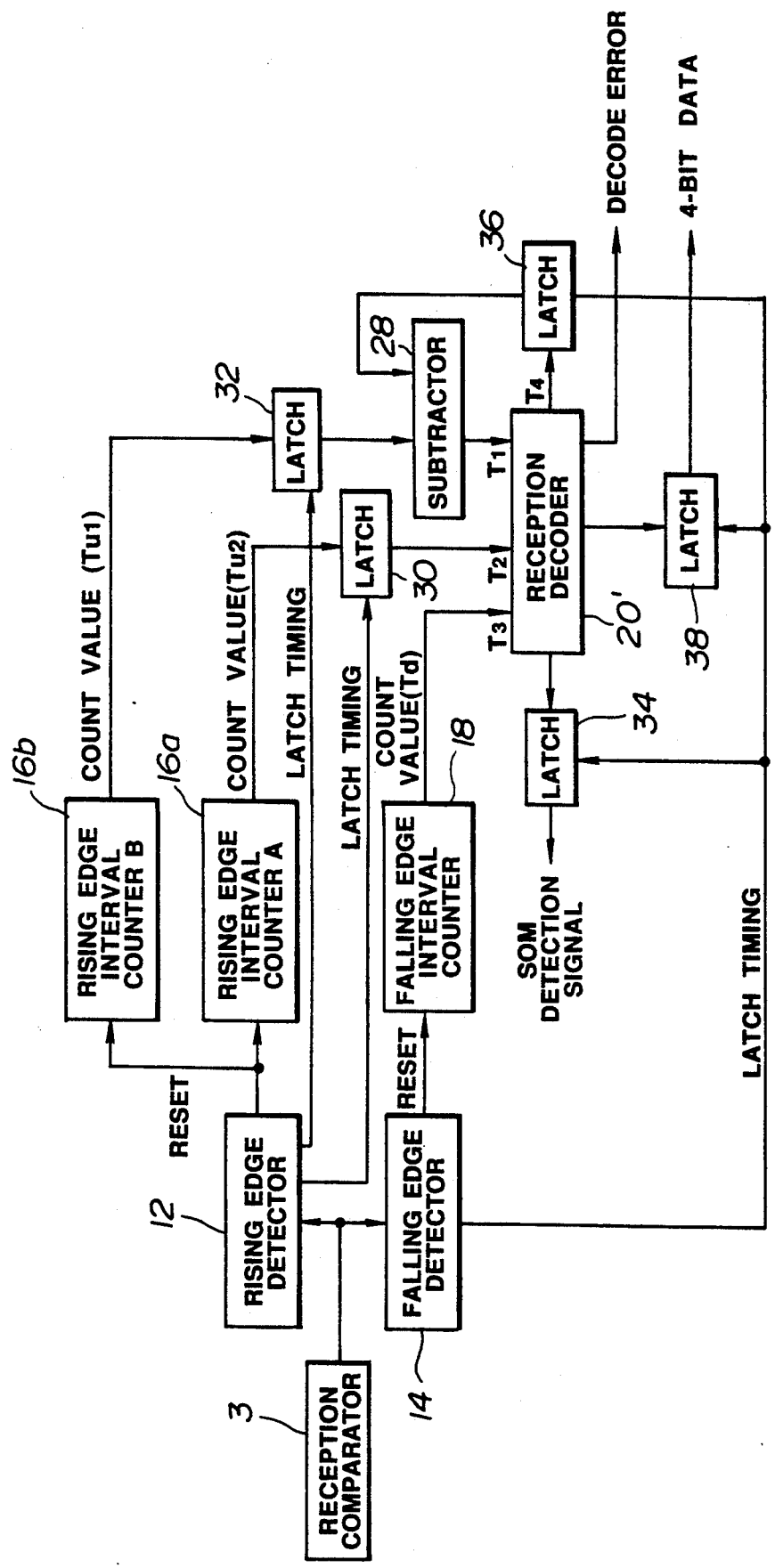
FIG. 6 is a circuit block diagram of a structure in a data communicating apparatus in a second preferred embodiment according to the present invention.

The coded communication signal is, then, processed at the reception circuit shown in FIG. 6.

FIG. 6 shows a structure of the communication reception circuit in the second preferred embodiment.

The communication signal derived from the reception comparator 3 is input to both rising edge detector 12 and falling edge detector 14. The rising edge detector 12 is connected with the rising edge interval measurement counter A 16a and falling edge interval measurement counter B 16b. The falling edge detector 14 is connected to the falling edge interval measurement counter 18. The output of the rising edge interval measurement counter A 16a is input to the reception decoder circuit 20' via the latch circuit 30. The output of the falling edge interval measurement counter is input to the reception decoder circuit 20'. The output of the rising edge interval measurement counter B 16b is input to the reception decoder circuit 20' after input to a subtractor 28 via the latch circuit 32.

Until the SOM is detected, the counter value Tu2(=T2) representing the rising edge interval time output from the edge interval measurement counter A 16a whenever the rising edge is detected is latched by means of a latch circuit 30, the rising edge interval measurement counter A 16a being reset to start counting.

The count value Td(=T3) representing the falling edge interval time is input to the reception decoder circuit 20'. The reception decoder 20' outputs the SOM detection signal when the SOM indicating that T2=6 and T3=2 is received on the basis of FIG. 5 (B).

Similarly, whenever each rising edge is detected, the values of the rising edge interval measurement counters A, B are alternatingly latched and reset to start counting.

In addition, the reception decoder circuit 20' outputs the four-bit data to the latch circuit 38 and the value of T 4 to the latch circuit 38, respectively, on the basis of FIG. 5 (B) from a value of T1(=Tu1−T4), T2(=Tu2) already latched during the receipt of data and with the rising edge interval measurement counters A, B as generating source and from a value of T3(=Td) with the falling edge interval measurement counter 18 as the generating source. If these values are not present in FIG. 5 (C), the decode error is output.

These outputs of the reception decoder 20' are latched with only even number of times of the falling edge as a latch timing and the falling edge interval measurement counter 18 is again reset to start counting.

Figure 7:
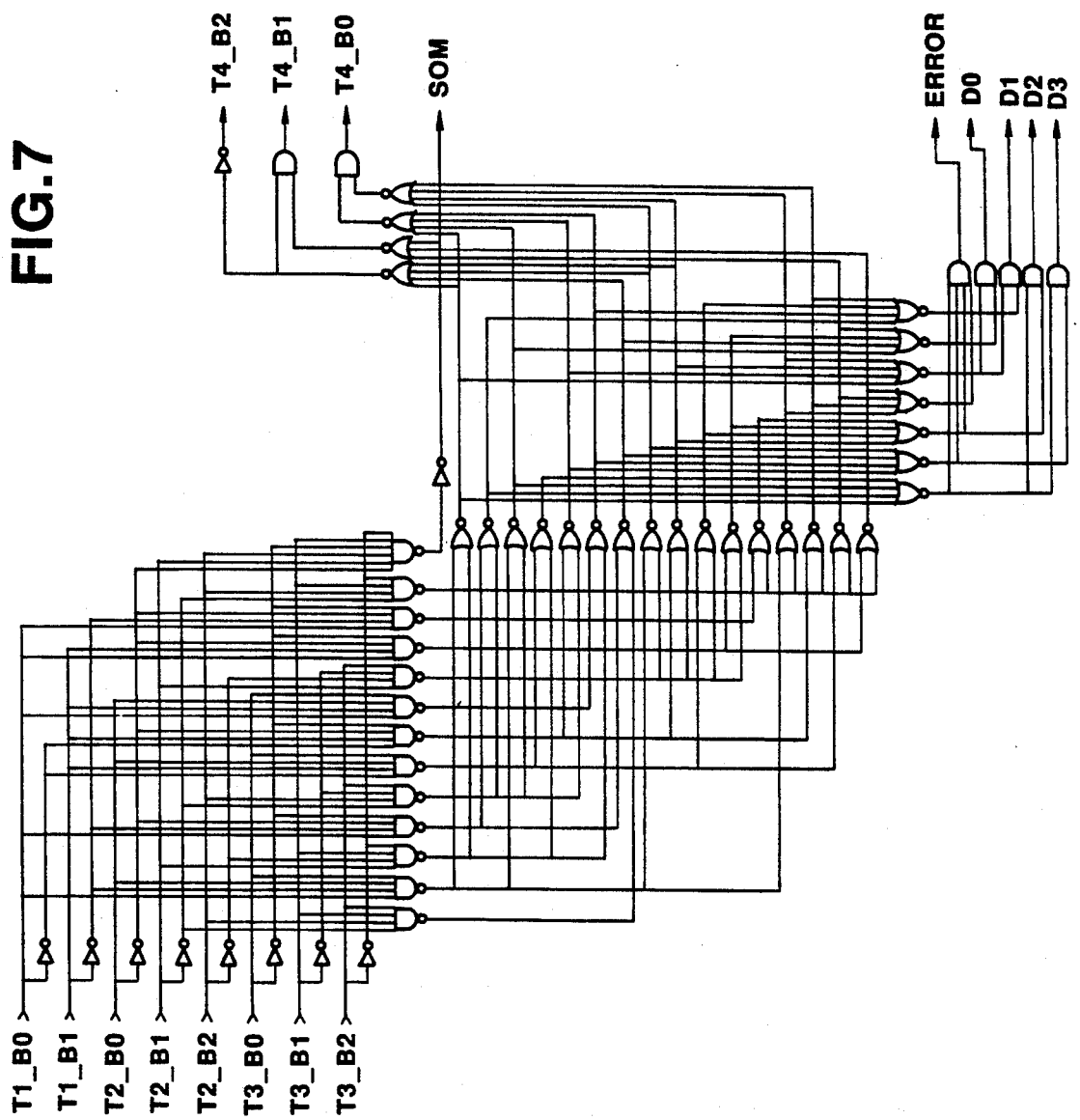
FIG. 7 is a circuit block diagram of a structure of a reception decoder circuit in the second preferred embodiment shown in FIG. 6.

FIG. 7 shows an example of the reception decoder circuit used in the series of processings described above.

A signal T1 is input to input terminals T1-B0 and T1-B1 from a subtractor 28. A signal T2 from the latch circuit 30 is input to input terminals T2-B0∼T2-B2. In addition, the signal T3(=Td) from the edge interval measurement counter 18 is input to input terminals T3-B0-T3-B2. The four-bit data are output to output terminals D0∼D3. The terminals T4-B0∼T4-B2 provide T4 as 3-bit values. It is noted that B0, B1, . . . of terminals represent bit numbers and the required number of bits corresponding to a maximum value of each input are prepared.

Figure 8:
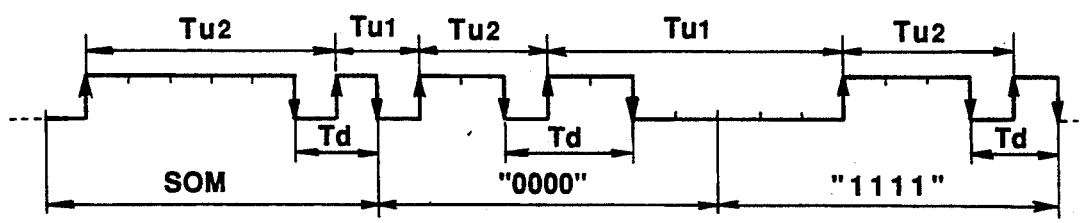
FIG. 8 is an explanatory view of the data format of SOM "0000" "1111" in the communication signal used in the second preferred embodiment.

In this way, in the communication signal indicated by, for example, FIG. 8, the SOM is detected by referring to FIG. 5 (B) from initially T 2=Tu 2=6 and T 3=Td=2 so that T 4=1 is latched.

Next, "0 0 0 0" is detected from such an indication that T 1=Tu 1−T 4=2−1=1,T 2=Tu 2=3, T 3=Td=3 and T 4=4. Similarly, in the next interval, "1111" is detected from such an indication that T 1=Tu−T 4=7−4=3, T 2=Tu 2=4, and T 3=Td=2 and T 4=1.

As described above, in the second preferred embodiment the four-bit communication data are expressed by the combinations of the eight signal levels. From among the eight signal levels, the initial signal level is set to the low level, the high potential levels and low potential levels being four, respectively, as a total, and the rising edge and falling edge being placed at the two positions. Thus, the mutually different combinations can be allocated to 16 combinations of the four bits.

Since the interval between the rising edges and between the falling edges are measured to decode the communication signal the decoding is possible without being influenced by the change in the pulsewidth.

Since, for the pulsewidth itself, both high potential and low potential are equally set to four, the DC component in the communication signal becomes constant and the pulsewidth cannot be changed depending on the value of the data. However, it is noted that it is not necessary for the high potential levels and low potential levels to always be equal numbers. If its ratio of the number is constant, a constant DC component of the communication signal can be obtained.

As described hereinabove, according to the present invention, the coding of the communication signal is carried out on the basis of the rising edge interval time or falling edge interval time of the transmission data (or both edge interval times on the rising edge and falling edge) to form the communication signal, the communication signal can be decoded until the communication signal vanishes without influence of change in the pulsewidth. Although the communication signal is transmitted as the communication signal which is distorted to a degree at which the increase/decrease in the pulsewidth causes the interference in the transmission of the communication signal and is not practical as a matter of fact, its reception and decoding become possible. Therefore, a higher anti-electromagnetic wave interference characteristic can be achieved.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A data communication apparatus, comprising:
   a) signal transmitting means for coding a transmission data having a combination of bits "1" and/or "0" data into a communication signal based on an interval of time between a first rising edge and a subsequent rising edge, the rising edge being defined as the communication signal state changing from a relatively low potential level to a relatively high potential level and for outputting the communication signal to at least one signal transmission line;
   b) first rising edge detecting means for detecting the rising edge of the communication signal inputted via the signal transmission line;
   c) first rising edge interval of time measuring means for measuring the interval of time from a time at which the first rising edge detected by the first rising edge detecting means occurs to a time at which the subsequent rising edge occurs; and
   d) decoding means for decoding the communication signal into either bit "1" or bit "0" according to the interval of time measured by the first rising edge interval of time measuring means.

2. A data communication apparatus as set forth in claim 1, wherein said decoding means decodes the communication signal into the bit "0" data when the measured interval of time at a beginning of which a predetermined rising edge occurs and at an end of which the subsequent rising edge occurs is a first predetermined time and into the bit "1" data when the measured interval of time at the beginning of which the predetermined rising edge occurs and at the end of which the subsequent rising edge occurs is a second predetermined time which is different from the first predetermined time.

3. A data communication apparatus as set forth in claim 2, wherein said decoding means decodes the communication signal into SOM (start of message) and a bit "0" data when the measured interval of time at the beginning of which an initial rising edge occurs and at the end of which the subsequent rising edge occurs is 6 T, wherein T denotes ⅓ bit time and 1/T denotes 3×baud rate.

4. A data communication apparatus as set forth in claim 3, wherein said decoding means decodes the communication signal into SOM (start of message) and a bit "1" data when the measured interval of time at the beginning of which the initial rising edge occurs and at the end of which the subsequent rising edge occurs is 7 T.

5. A data communication apparatus as set forth in claim 4, wherein said decoding means decodes the communication signal into the bit "0" data when the measured interval of time at the beginning of which the initial rising edge occurs and at the end of which the rising edge occurs is expressed as $T \times \{4 \times (N-1)+6\}$ and into the bit "1" data when the measured interval of time is expressed as $T \times \{4 \times (N-1)+7\}$, wherein N denotes a natural number equal to or exceeding 1.

6. A data communication apparatus as set forth in claim 4, wherein said decoding means decodes the communications signal into the bit "0" data when a previous bit data is determined to be the bit "1" data and when a measured interval of time Tu at the beginning of which the rising edge occurs and at the end of which the subsequent rising edge occurs, is 3 T or when the previous bit data is determined to be the "0" data and when the measured interval of time Tu is 4 T and said decoding means decodes the communication signal into the bit "1" data when the previous data is determined to be the bit "1" data and the measured interval of time Tu at the beginning of which the rising edge occurs and at the end of which the subsequent rising edge occurs is 4 T or when the previous data is determined to be the bit "0" data and when the measured interval of time Tu, at the beginning of which the rising edge occurs and at the end of which the subsequent rising edge occurs, is 5 T.

7. A data communication apparatus as set forth in claim 2, wherein said decoding means decodes the communication signal into a SOM (start of message) and a "0" data bit when the measured interval of time between an initial rising edge and the subsequent rising edge occurs is 6 T, wherein T denotes a ⅓ bit time, said decoding means decoding the communication signal into the SOM (start of message) and a "1" data bit when the measured interval of time between the initial rising edge the subsequent rising edge is 7 T, said decoding means decoding the communication signal into a "0" data bit when a previous data bit is "1" and a time interval, Tu, measured from the predetermined rising edge to a subsequent rising edge of the communication signal is 3 T, and said decoding means decodes the signal into a "0" data bit when the previous data bit is "0" and the time interval Tu is 4 T, said decoding means decoding the communication signal into a "1" data bit when the previous data bit is "1" and Tu is 4 T, and decoding the communication signal into a "1" data bit when the previous data bit is "0" and Tu is 5 T.

8. A data communication apparatus, comprising:
a) signal transmitting means for coding a transmission data having a combination of bits "1" and/or "0" data into a communication signal based on an interval of time between a falling edge and a subsequent falling edge, the falling edge being defined as the communication signal state changing from a relatively high potential level to a relatively low potential level and for outputting the communication signal to at least one signal transmission line;
b) second falling edge detecting means for detecting the falling edge of the communication signal inputted via the signal transmission line;
c) second falling edge interval of time measuring means for measuring the interval of time from a time at which the falling edge detected by the second falling edge detecting means occurs to a time at which the subsequent falling edge occurs; and
d) decoding means for decoding the communication signal into either bit "1" or bit "0" according to the interval of time measured by the second falling edge interval of time measuring means.

9. A data communication apparatus as set forth in claim 8, wherein said decoding means decodes the communication signal into the bit "0" data when the measured interval of time at a beginning of which a predetermined falling edge occurs and at an end of which the subsequent falling edge occurs is a third predetermined time and into the bit "1" data when the measured interval of time at the beginning of which the predetermined falling edge occurs and at the end of which the subsequent falling edge occurs is a fourth predetermined time which is different from the third predetermined time.

10. A data communication apparatus as set forth in claim 9, wherein said decoding means decodes the communication signal into SOM (start of message) and a bit "0" data when the measured interval of time at the beginning of which an initial falling edge occurs and at the end of which the subsequent falling edge occurs is 5 T, wherein T denotes ⅓ bit time and 1/T denotes 3×baud rate.

11. A data communication apparatus as set forth in claim 10, wherein said decoding means decodes the communication signal into SOM (start of message) and a bit "1" data when the measured interval of time at the beginning of which the initial falling edge occurs and at the end of which the subsequent falling edge occurs is 4 T.

12. A data communication apparatus as set forth in claim 11, wherein said decoding means decodes the communication signal into the bit "0" data when the measured interval of time at the beginning of which the initial falling edge occurs and at the end of which the falling edge occurs is expressed as $T \times \{4 \times (N-1)+5\}$ and into the bit "1" data when the measured interval of time is expressed as $T \times \{4 \times (N-1)+4\}$, wherein N denotes a natural number equal to or exceeding 1.

13. A data communication apparatus as set forth in claim 11, wherein said decoding means decodes the communications signal into the bit "0" data when a previous bit data is determined to be the bit "1" data and when a measured interval of time Td, at the beginning of which the falling edge occurs and at the end of which the subsequent falling edge occurs, is 5T or when the previous bit data is determined to be the bit "0" data and when the measured interval of time Td is 4T and said decoding means decodes the communication signal into the bit "1" data when the previous bit data is determined to be the bit "1" data and when the measured interval of time Td, at the beginning of which the rising edge occurs and at the end of which the subsequent falling edge occurs, is 4T or when the previous bit data is determined to be the bit "0" data and when the measured interval of time Td, at the beginning of which the falling edge occurs and at the end of which the subsequent falling edge occurs, is 3T.

14. A data communication apparatus as set forth in claim 9, wherein said decoding means decodes the communication signal into a SOM (start of message) and a "0" data bit when a measured interval of time from an initial falling edge occurs and the subsequent falling edge occurs is 5 T, wherein T denotes a ⅛ bit time, said decoding means decoding the communication signal into a SOM (start of message) and a "1" data bit when the measured interval of time between the initial falling edge and the subsequent falling edge occurs is 4 T, said decoding means decoding the communications signal into a "0" data bit when a previous bit data is "1" and a measured interval of time, Td, between the predetermined falling edge and the subsequent falling edge occurs is 5T and decoding the communications signal into a "0" bit when the previous bit data is "0" data and Td is 4T, said decoding means decoding the communication signal into a "1" data bit when the previous data bit is "1" data and Td is 4T and decoding the communication signal into a "1" when the previous data bit is "0" and Td is 3T.

15. A data communication apparatus, comprising:
a) signal transmitting means for coding a transmission data having a combination of bits "1" and/or "0" data into a communication signal based on a first interval of time between a first rising edge and a subsequent rising edge, the rising edge being defined as the communication signal state changing from a relatively low potential level to a relatively high potential level, and based on a second interval of time at which a falling edge and a subsequent falling edge occur, the falling edge being defined as the communication signal state changing from the relatively high potential level to the relatively low potential level, and for outputting the communication signal to at least one signal transmission line;
b) first rising edge detecting means for detecting the rising edge of the communication signal inputted via the signal transmission line;
c) second falling edge detecting means for detecting the falling edge of the communication signal inputted via the signal transmission line;
d) first rising edge interval of time measuring means for measuring the first interval of time from a time at which the first rising edge detected by the first rising edge detecting means occurs to a time at which the subsequent rising edge occurs;
e) second falling edge interval of time measuring means for measuring the second interval of time from a time at which the falling edge detected by the second falling edge detecting means occurs and the subsequent falling edge occurs; and
f) decoding means for decoding the communication signal into either bit "1" or bit "0" according to the first and second intervals of times measured by the respective first and second rising and falling edge interval of time measuring means.

16. A data communication apparatus as set forth in claim 15, wherein said decoding means decodes the communication signal into the bit "0" data when the measured first interval of time at a beginning of which a predetermined rising edge occurs and at an end of which the subsequent rising edge occurs is a first predetermined time and into the bit "1" data when the first interval of time at the beginning of which the predetermined rising edge occurs and at the end of which the subsequent rising edge occurs is a second predetermined time which is different from the first predetermined time and decodes the communication signal into the bit "0" data when the measured second interval of time at a beginning of which a predetermined falling edge occurs and at an end of which the subsequent falling edge occurs is a third predetermined time and into the bit "1" data when the measured second interval of time at the beginning of which the predetermined falling edge occurs and at the end of which the subsequent falling edge occurs is a fourth predetermined time which is different from the third predetermined time.

17. A data communication apparatus as set forth in claim 16, wherein said signal transmission means codes the transmission data having the combination of the bit "0" data and/or the bit "1" data into the communication signal based on a permutation of the intervals of times on the rising edge and on the falling edges within a predetermined unit of time slot and outputs the communication signal to the signal transmission line.

18. A data communication apparatus as set forth in claim 17, wherein said signal transmission means codes the transmission data into the communication signal having the rising edge and falling edge within the predetermined unit of time slot, the numbers of the rising edge and falling edge being respectively two or more, and a ratio in time of the respectively low potential level to the respectively high potential level being a constant.

19. A data communication apparatus as set forth in claim 18, wherein the transmission data is a four-bit data having 18 combination of eight signal levels, an initial signal level of the eight signal levels being the low potential level, the high potential level having four, the low potential level having four, the rising edge and falling edge having two positions respectively.

20. A data communication apparatus as set forth in claim 15, wherein said decoding means decodes the communication signal into a "0" data bit when the first interval of time between the predetermined rising edge and the subsequent rising edge is a first predetermined time, said decoding means decoding the communication signal into a "1" data bit when the first interval of time is a second predetermined time, said decoding means decoding the communication signal into a "0" data bit when the second interval of time between the predetermined falling edge and the subsequent falling edge is a third predetermined time, and said decoding means decoding the communication signal into a "1" data bit when the second interval of time is a fourth predetermined time.

* * * * *